(12) United States Patent
Ogata et al.

(10) Patent No.: US 8,299,806 B2
(45) Date of Patent: Oct. 30, 2012

(54) SENSOR APPARATUS FOR DETECTING A POSITIONAL RELATIONSHIP BETWEEN TWO MEMBERS AND METHOD USED FOR THE SENSOR APPARATUS

(75) Inventors: Masako Ogata, Yokohama (JP);
Hideyuki Funaki, Tokyo (JP);
Kazuhiro Suzuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 440 days.

(21) Appl. No.: 12/717,579

(22) Filed: Mar. 4, 2010

(65) Prior Publication Data

US 2010/0231246 A1 Sep. 16, 2010

(30) Foreign Application Priority Data

Mar. 13, 2009 (JP) .................................. 2009-060926

(51) Int. Cl.
*G01R 27/26* (2006.01)
(52) U.S. Cl. .......................... 324/662; 324/671; 324/672
(58) Field of Classification Search .................. 342/662, 342/665, 671, 672, 679, 705
See application file for complete search history.

(56) References Cited

U.S. PATENT DOCUMENTS 6,072,318 A * 6/2000 Jordil ............................. 324/660
2008/0278178 A1* 11/2008 Philipp ......................... 324/662

FOREIGN PATENT DOCUMENTS

JP 2008-192319 8/2008

* cited by examiner

*Primary Examiner* — Vincent Q Nguyen
(74) *Attorney, Agent, or Firm* — Turocy & Watson, LLP (57) ABSTRACT

A sensor apparatus for detecting a positional relationship includes a first electrode, an applying unit applying a charging signal with a first cycle period to the first electrode, a second electrode, a selecting unit selecting the first or second cycle period which have overlapped segment periods, an output unit outputting electrical signals supplied from the second electrode with the first cycle period, if the first cycle period is selected, and parts of the electrical signals during the segment periods, if the second cycle period is selected, a comparator comparing an amplitude of the electrical signals with a threshold value and generating a first or second comparison signal and a controller generating a proximity and non-proximity signal in response to the first and second comparison signal, respectively, so that the selecting unit selects the first and second cycle period in response to the proximity and non-proximity signal, respectively.

10 Claims, 5 Drawing Sheets

SENSOR APPARATUS FOR DETECTING A POSITIONAL RELATIONSHIP BETWEEN TWO MEMBERS AND METHOD USED FOR THE SENSOR APPARATUS

CROSS-REFERENCE TO RELATED APPLICATIONS

This application is based upon and claims the benefit of priority from prior Japanese Patent Application No. 2009-060926, filed Mar. 13, 2009, the entire contents of which are incorporated herein by reference.

BACKGROUND OF THE INVENTION

1. Field of the Invention

The present invention relates to a sensor apparatus for detecting a positional relationship between two members arranged in opposed relation to each other, using a change in electrostatic capacitance between electrodes of the respective members and a method used for the sensor apparatus.

2. Description of the Related Art

In recent years, a proximity sensor of electrostatic capacitance detection type has been proposed for detecting a proximity of an object (JP-A 2008-192319 (KOKAI)). In this sensor of electrostatic capacitance type, a first member constituting an object of detection and a second member of the sensor part have first and second electrodes, respectively, which are so arranged as to be opposed to each other. Of these electrodes, the one arranged on the first member is supplied with an electrical signal. The sensor detects a change in electrostatic capacitance between the first and second electrodes using the electrode arranged on the second member, thereby detecting a relative positional change of the members.

The sensor apparatus for detecting the proximity between two members is used for electronic devices such as a mobile phone. In the mobile phone, for example, the power consumption is required to be suppressed as far as possible to permit the use for a long time. In a conventional magnetic sensor apparatus, the positional relationship between a magnet and a Hall element. The magnet is arranged on a first member constituting an object of detection. The Hall element is arranged on a second member constituting a sensor part. In the process, the magnetic sensor apparatus detects a magnetic field from the magnet by driving the Hall element intermittently with a predetermined period. As a result, the power consumption of the sensor apparatus is suppressed and a waste of a battery power can be reduced.

As described above, if the electronic devices are required to suppress the power consumption, it is desirable for the sensor apparatus for detecting the proximity between two members to be operated intermittently so as to suppress the waste of the battery power. In the sensor apparatus of electrostatic capacitance detection type, however, the object of detection and the sensor part are operated independently of each other. This poses the problem that an attempt to operate the sensor apparatus intermittently fails to detect the relative positions of the members successfully due to the different intermittent operations between the object of detection and the sensor part.

As understood from the foregoing description, the intermittent operation of the sensor apparatus of electrostatic capacitance detection type harbors the problem that the relative positions of the members cannot be successfully detected in the case where the intermittent operation of the object of detection and that of the sensor part are different from each other.

BRIEF SUMMARY OF THE INVENTION

According to one embodiment of the present invention, there is provided a sensor apparatus for detecting a positional relationship between first and second members having first and second surfaces, respectively, comprising: a first electrode provided on the first surface of the first member; an applying unit configure to apply a charging signal periodically with a first cycle period to the first electrode so that first charges are induced on the first surface of the first member; a second electrode provided on the second surface of the second member to generate electrical detecting signals with the first cycle periods depending on second charges which are induced on the second surface due to the first charges held on the first surface and are changed with the first cycle period depending on a distance between the first and second surfaces; a selecting unit configured to select one of the first cycle period and a second cycle period which is different from the first cycle period, the first and second cycle periods being partially overlapped in respective segment periods; an output unit which periodically receives the electrical detecting signals from the second electrode, which allows parts of the electrical detecting signals to be output from the output unit during the segment periods, if the second cycle period is selected, and allows the electrical detecting signals to be output from the output unit with the first cycle in synchronized with the charging signals, if the first cycle period is selected; a comparator configure to compare an amplitude of the part of the electrical detecting signal or the electrical detecting signal from the output unit with a predetermined threshold value and generate a first comparison signal when the amplitude is not less than the predetermined threshold value and a second comparison signal when the amplitude is less than the predetermined threshold value, respectively; and a controller configure to generate, in response to the first comparison signal, a proximity signal which indicates the proximity of the first and second members, and to generate, in response to the second comparison signal, a non-proximity signal which indicates the non-proximity of the first and second members, wherein the selecting unit selects the second cycle period in response to the non-proximity signal, and selects the first cycle period in response to the proximity signal so that the proximity signal is continuously generated depending on the successive generation of the first comparison signals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A sensor apparatus according to embodiments of the invention is explained in detail below with reference to the drawings.

Figure 1:
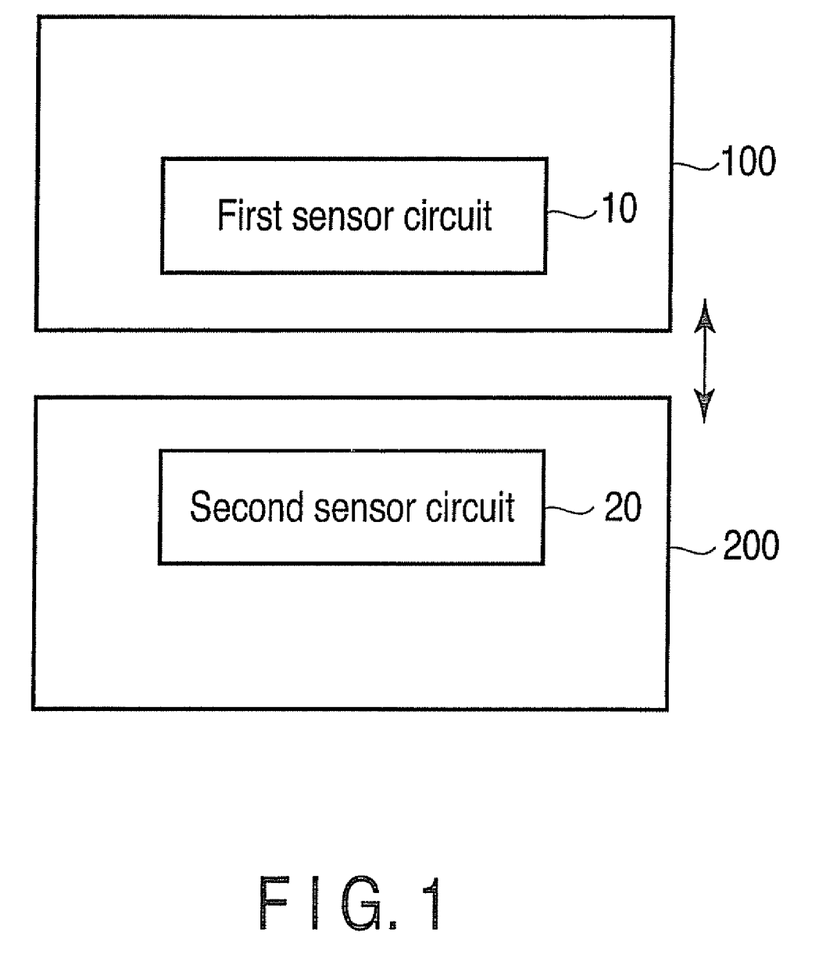
FIG. 1 is a diagram showing a configuration of a sensor apparatus according to a first embodiment of the invention.

FIG. 1 is a schematic diagram showing a configuration of the sensor apparatus according to an embodiment of the invention. The sensor apparatus comprises a first sensor circuit 10 arranged on a first member 100 and a second sensor circuit 20 arranged on a second member 200. The first and second members 100, 200 have first and second surfaces which are arranged so as to be opposed to each other, and on which first and second electrodes 13, 21 are provided. In the case where the members 100, 200 come close to each other, the first electrode 13 of the first sensor circuit 10 and the second electrode 21 of the second sensor circuit 20 approach each other in opposed relation. The sensor apparatus detects a change in electrostatic capacitance between the first electrode 13 of the first sensor circuit 10 and the second electrode 21 of the second sensor circuit 20. In this way, the sensor apparatus detects the relative positions of the members 100, 200, i.e. whether the members 100, 200 are approaching or coming away from each other.

Figure 2:
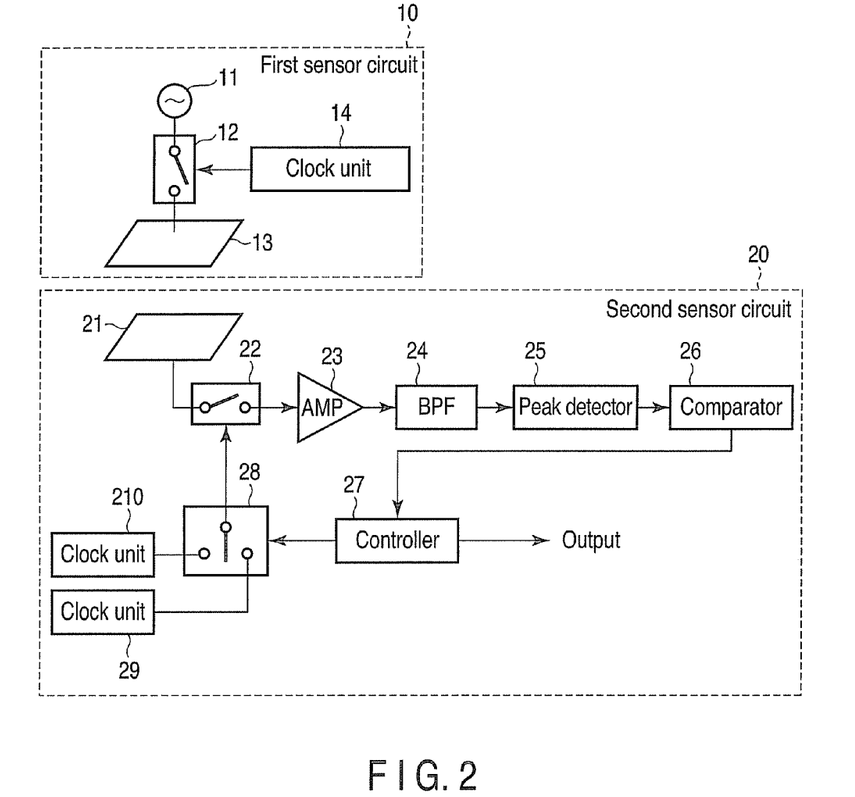
FIG. 2 is a block diagram showing a functional configuration of the sensor apparatus of FIG. 1.

FIG. 2 is a block diagram showing the functional configuration of the sensor apparatus of FIG. 1. In the first sensor circuit 10, alternating current generated from an AC power supply 11 is supplied to the first electrode 13 through a first switch 12. The first switch 12 is connected between the power supply 11 and the first electrode 13 for driving the first sensor circuit 10 intermittently. That is, the first sensor circuit 10 is operated while the first switch 12 is on so that the electrical signal is supplied to the first electrode 13 from the AC power supply 11, and is not operated while the first switch 12 is off so that the electrical signal is prevented from being supplied to the first electrode 13 from the AC power supply 11. The first switch 12 receives a first clock signal, i.e., a periodical switching signal, having a first cycle period T1 from a clock unit 14. In accordance with the first clock signal, the first switch 12 periodically permits the alternating current to be supplied from the AC power supply 11 to the first electrode 13. Thus, the first electrode 13 periodically charges the surface portion of the member 100, depending on an application of the supplied alternating current on the first electrode 13.

The second sensor circuit 20 detects the change in electrostatic capacitance between the first and second electrodes 13 and 21, and thus detects the relative positions of the first and second members 100, 200. The second electrode 21 is arranged on the surface of the member 200. The electrode 21 induces, at the portion where it is arranged, charges corresponding to the charges held at the portion where the first electrode 13 is arranged. In the process, the charges induced by the electrode 21 change with the distance between the first and second electrodes 13 and 21.

A second switch 22 is provided in the second sensor circuit 20, for driving the second sensor circuit 20 intermittently. The second sensor circuit 20 is operated so as to sense electrical charges produced on a portion of the second surface on which the second electrode is provided, while the second switch 22 is on, and is prevented from being operated so as not to sense the electrical charges, while the second switch 22 is off. In the second sensor circuit 20, an electrical signal is sensed as a voltage on the second electrode 21 which is produced based on the electrical charges induced on the second surface portion by the second electrode 21. The sensed electrical signal is supplied to an amplifier (AMP) 23 through the second switch 22 which is switched based on one of the second and third clock signals, i.e., second and third periodical switching signals supplied from clock units 29 and 210, respectively. The amplifier 23 amplifies the received electrical signal and outputs an amplified signal to a band-pass filter (BPF) 24. The band-pass filter 24 filters the electrical signal to remove the noise component from the received electrical signal and outputs the electrical signal to a peak detector 25. The peak detector 25 detects the peak level of the received electrical signal.

A comparator 26 receives the peak level signal from the peak detector 25, and judges whether the amplitude level, i.e., the peak level of the peak level signal from the peak detector 25 is not less than a threshold value set in advance. In the case where the amplitude of the signal from the peak detector 25 is not less than the threshold value, the comparator 26 outputs the peak level signal to a controller 27. In addition, in the case where the amplitude of the signal from the peak detector 25 is less than the threshold value, the comparator 26 outputs a signal of which the amplitude is zero to the controller 27.

The controller 27 judges whether the first and second members 100, 200 have approached each other or not, based on the output signal from the comparator 26. In accordance with the judgment of a proximity of the first and second members 100, 200, the controller 27 generates a proximity signal indicating that the members 100, 200 have approached each other. In accordance with the judgment of the non-proximity of the first and second members 100, 200, the controller 27 generates a non-proximity signal indicating that the members 100, 200 have not approached each other. The proximity signal or non-proximity signal is supplied to a change-over unit 28 and to a device or devices in subsequent stages (not shown).

The change-over unit 28 is switched to one of the clock units 29, 210 which is selected in response to the proximity signal or the non-proximity signal from the controller 27, so that the clock signal from the selected one of clock units 29 or 210 to the second switch 22. In the change-over unit 28, upon reception of the non-proximity signal from the controller 27, a second clock signal having a second cycle period T2 is output from the second clock unit 29 and is supplied to the second switch 22. In the case where the change-over unit 28 receives the proximity signal from the controller 27, on the other hand, a third clock signal having the first cycle period T1 is output from the clock unit 210 and is supplied to the second switch 22.

Figure 3:
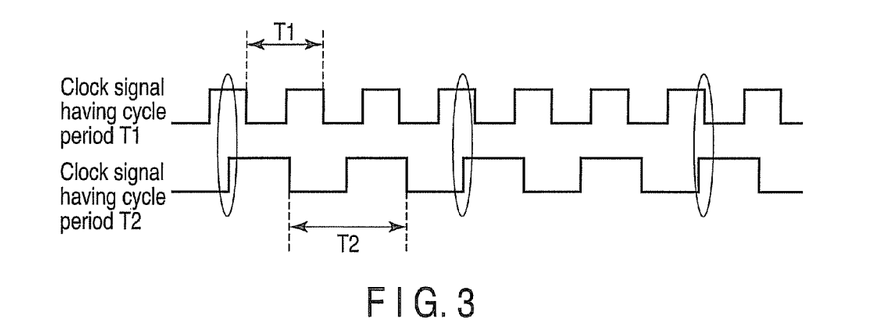
FIG. 3 is a diagram showing the relation between two types of clock signals generated in the sensor apparatus of FIG. 2.

Next, the relationship between the first clock signal having the first cycle period T1 and the second clock signal having the cycle period T2 is explained. FIG. 3 is a schematic diagram showing the relationship between the first clock signal having the first cycle period T1 and the second clock signal having the second cycle period T2. The amplitude of the first and second clock signals are periodically changed between low and high levels at the different cycle periods T1 and T2, as shown in FIG. 3. However, as indicated by the circular portions in FIG. 3, both of the two clock signals are periodically set to have the high levels in such a manner that a leading edge of the second clock signal is appeared in a period in which the first clock signal is maintained in the high level. Thus, the first and second clock signals have segment periods in which both signals are overlapped during a predetermined period of time. The predetermined period of time is sufficiently short as compared with, for example, the time taken to close the mobile phone. By using the clock signals of the period meeting this requirement, the sensor apparatus can perform the operation to detect the relative positions of the first and second members 100, 200 at least once in the predetermined time period.

Figure 4:
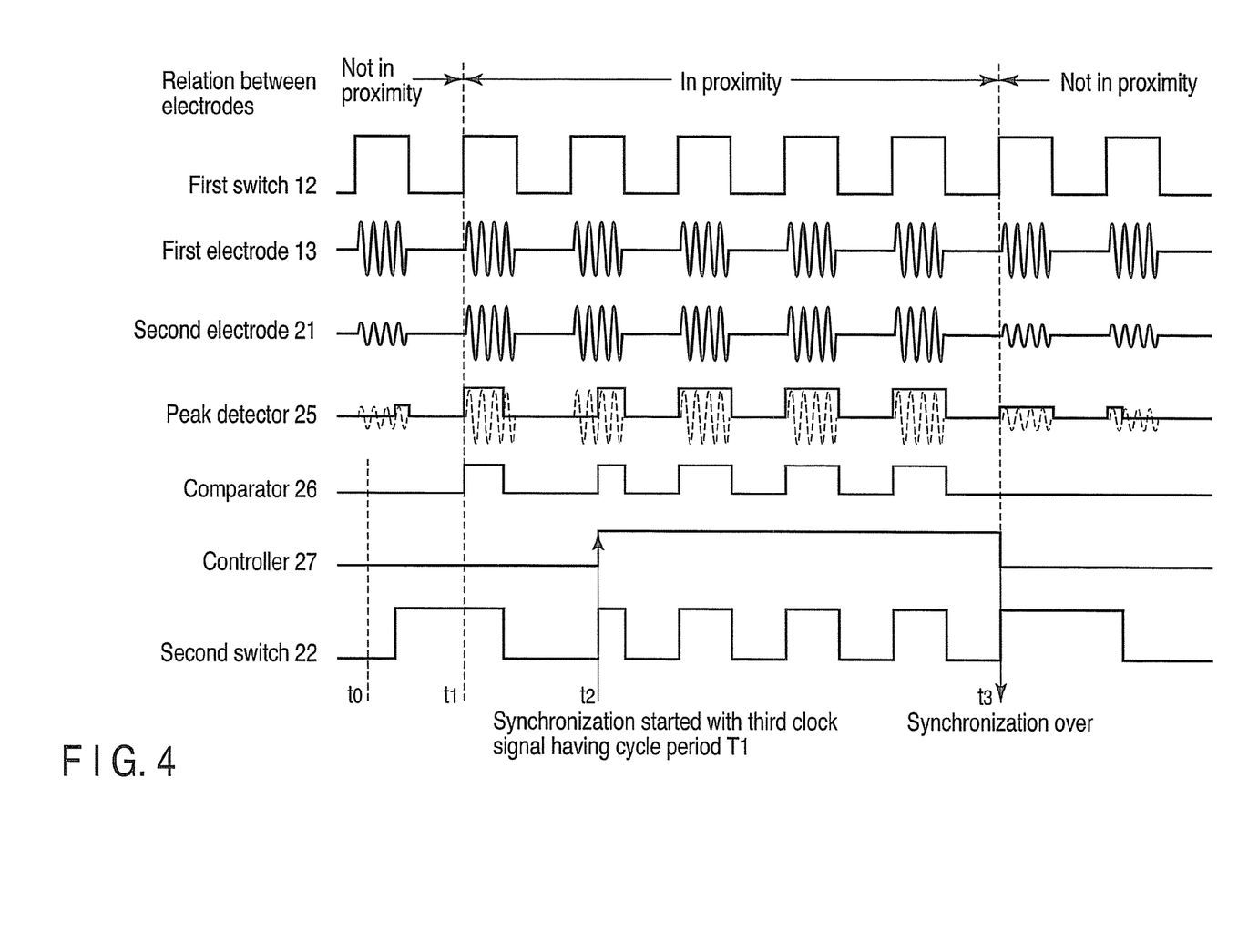
FIG. 4 is a diagram showing the signals output from the component elements of the sensor apparatus of FIG. 2.
Figure 5:
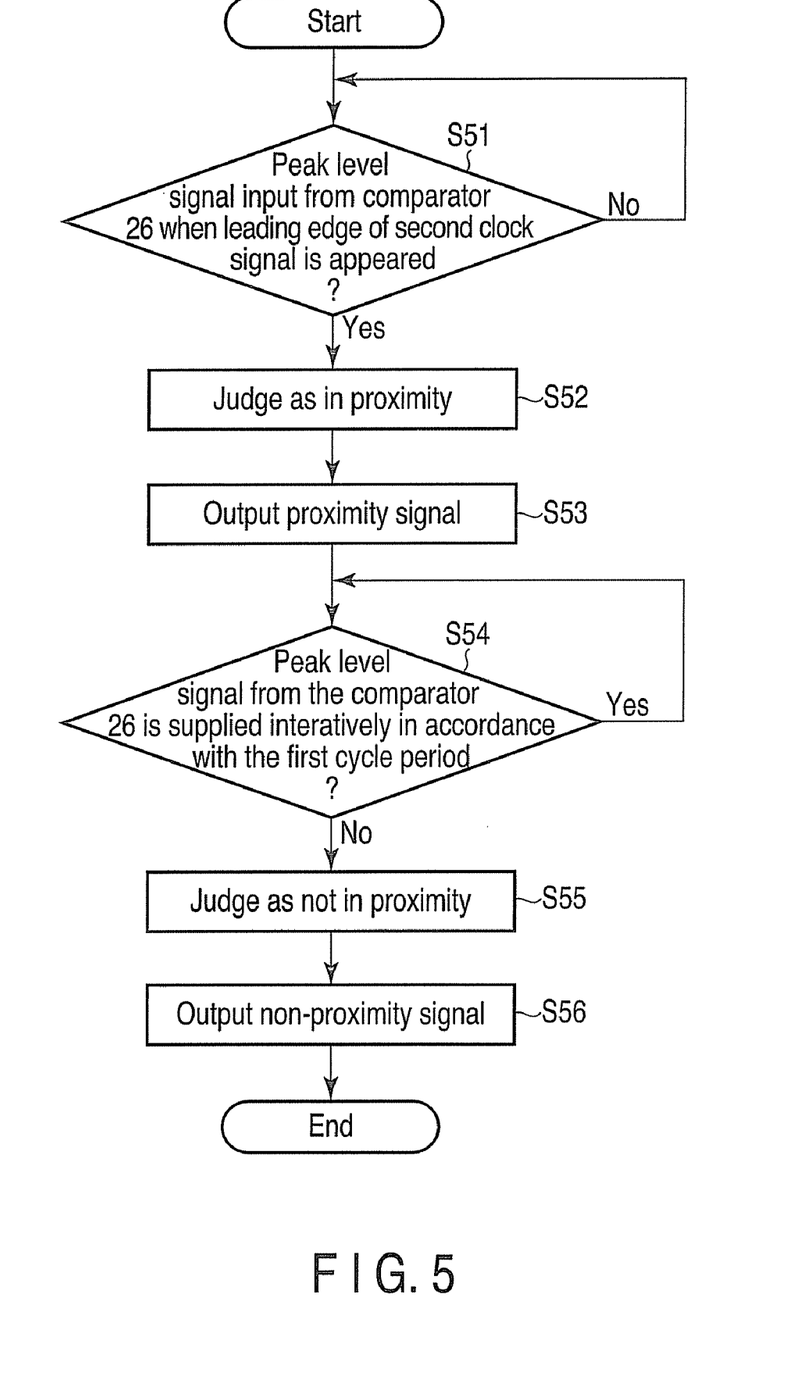
FIG. 5 is a flowchart of the process controlled by a controller for the switching operation of a switching unit.

Next, the operation performed with the configuration described above is explained. FIG. 4 is a schematic diagram showing the signals output from the component elements of the sensor apparatus according to an embodiment of this invention. FIG. 5 is a flowchart showing the process executed by the controller 27 of FIG. 2 to control the operation of the change-over unit 28.

First, the first switch 12 is operated in accordance with the first clock signal having the first cycle period T1 from the clock unit 14. Thus, the first electrode 13 is supplied with an alternating current in accordance with the first clock signal having the first cycle period T1.

The charges induced by the second electrode 21 produces a voltage to the second electrode 21. The voltage is delivered as a sensing signal through the second switch 22 to the amplifier 23 in accordance with the second clock signal having the period T2 from the clock unit 29 or the third clock signal having the first cycle period T1 from the clock unit 210. In the case where the first and second members 100, 200 are not in proximity to each other, the charges induced at the portion where the second electrode 21 is arranged are so small that the amplitude of the electrical sensing signal supplied to the amplifier 23 is also small. In the case where the first and second members 100, 200 are in proximity to each other, on the other hand, the charges induced at the portion where the second electrode 21 is arranged are so large that the amplitude of the electrical sensing signal supplied to the amplifier 23 is also large.

The electrical sensing signal supplied from the second switch 22 is amplified by the amplifier 23, and after passing through the band-pass filter 24, output to the peak detector 25. The peak detector 25 detects the peak value of the electrical sensing signal from the band-pass filter 24 and outputs a peak level signal having a rectangular waveform.

The comparator 26 receives the peak level signal from the peak detector 25, and outputs the peak level signal to the controller 27 in the case where the amplitude of the peak level signal is not less than the threshold value. On the other hand, the comparator 26 outputs the signal of which the amplitude is zero to the controller 27 in the case where the amplitude of the peak level signal is less than the threshold value.

The controller 27 judges whether the peak level signal from the comparator 26 is input when the leading edge of the second clock signal is appeared (step 51). In the case where the peak level signal from the comparator 26 is input to the controller 27 when the leading edge of the second clock signal is appeared shown by a time point t2 in FIG. 4 (YES in step 51), the controller 27 judges that the first and second members 100 and 200 have approached each other (step 52). The controller 27, upon judgment that the first and second members 100, 200 are in proximity to each other, outputs a signal of a predetermined amplitude value (i.e. the proximity signal) to the change-over unit 28 and the devices in subsequent stages (step 53).

In the case where the signal of which the amplitude is zero from the comparator 26 is input to the controller 27 shown by a time point t0 in FIG. 4 or the peak level signal is not input when the leading edge of the second clock signal is appeared shown by a time point t1 in FIG. 4 (NO in step 51), the controller 27 repeats the flow of the judgment process shown in step 51 until the peak level signal from the comparator 26 is input to the controller 27 when the leading edge of the second clock signal is appeared.

The change-over unit 28, upon reception of the proximity signal from the controller 27, switches the connection to the third clock signal having the first cycle period T1 output from the clock unit 210, and supplies the third clock signal to the second switch 22 so that the second switch 22 is switched based on the third clock signal in synchronized with the charges held on the first electrode.

In the case where the first and second members 100 and 200 are in proximity to each other, the controller 27 judges whether the peak level signal from the comparator 26 is supplied iteratively in accordance with the first cycle period (step 54). If the controller 27 judges that the peak level signal from the comparator 26 is not supplied iteratively in accordance with the first cycle period shown by a time period t3 in FIG. 4 (No in step 54), the controller 27 judges that the first and second members are not in proximity to each other (step 55). The controller 27, upon judgment that the first and second members 100 and 200 are not in proximity to each other, stops outputting the proximity signal to the change-over unit 28 and the devices, and outputs a signal zero in amplitude (i.e. the non-proximity signal) to the change-over unit 28 and the devices (step 56). That is, the controller 27 continues to output the proximity signal from the time point t2 until the time point t3.

The change-over unit 28, upon reception of the non-proximity signal from the controller 27, switches the connection to the second clock signal having the second cycle period T2 input from the clock unit 29, and supplies the second clock signal to the second switch 22.

Figure 6:
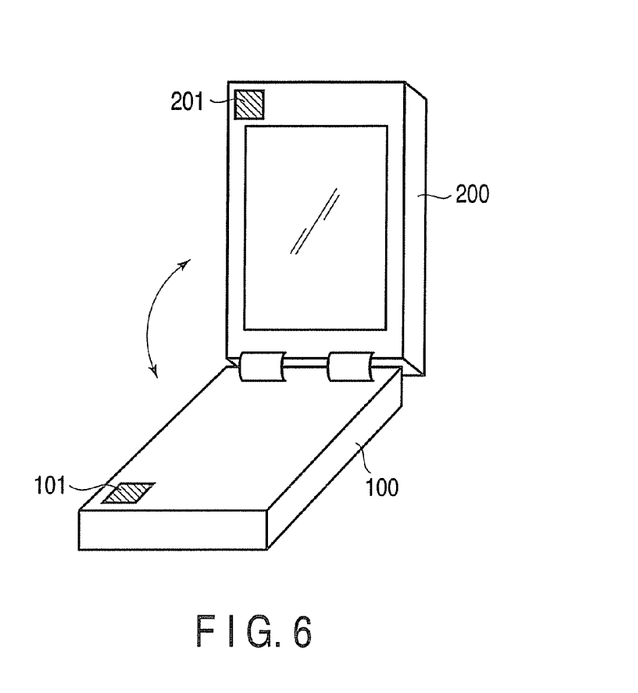
FIG. 6 is a diagram showing an example of the application of the sensor apparatus of FIG. 1 to a mobile communication terminal.

FIG. 6 is a schematic diagram showing an example of the application of the sensor apparatus according to an embodiment of the invention to a mobile communication terminal. The mobile communication terminal is presumed to be a mobile phone. In FIG. 6, the first member 100 corresponds to the lower member of the mobile phone, and the second member 200 corresponds to the upper member of the mobile phone. The first electrode 13 of the first sensor circuit 10 is arranged in an electrode arrangement area 101, and the electrode 21 of the second sensor circuit 20 in an electrode arrangement area 201.

As long as the mobile phone is open, the first sensor circuit 10 is operated intermittently with the first cycle period T1 and the second sensor circuit 20 is operated with the second cycle period T2. Once the mobile phone is closed, the sensor apparatus detects the proximity between the first and second members 100, 200 by the process described above. In the case where the members are in proximity to each other, the intermittent operation of the second sensor circuit 20 is synchronized with that of the first sensor circuit 10.

The first and second cycle periods T1 and T2 are determined taking the manual open/close operation of the mobile phone into consideration. Assuming it takes about 0.5 seconds to close the mobile phone manually, a sufficient period for detecting the open/close operation of the mobile phone is considered about 0.1 second. Also, in the case where the oscillation frequency of the AC power supply 11 is several tens of kHz to several hundred kHz, a pulse width is required to be 10 μsec to 1 msec to detect several wavelengths of the alternating current as an analog signal.

Specifically, the first clock signal having the first cycle period T1 is periodically set to have the high levels of 10 μsec to 1 msec plurally during 0.1 second. The second clock signal having the second cycle period T2, even though not synchronized with the first clock signal, can be set in such a manner that the leading edge of the second clock signal is appeared in a period in which the first clock signal is maintained in the high level at least once in 0.1 second.

Figure 7:
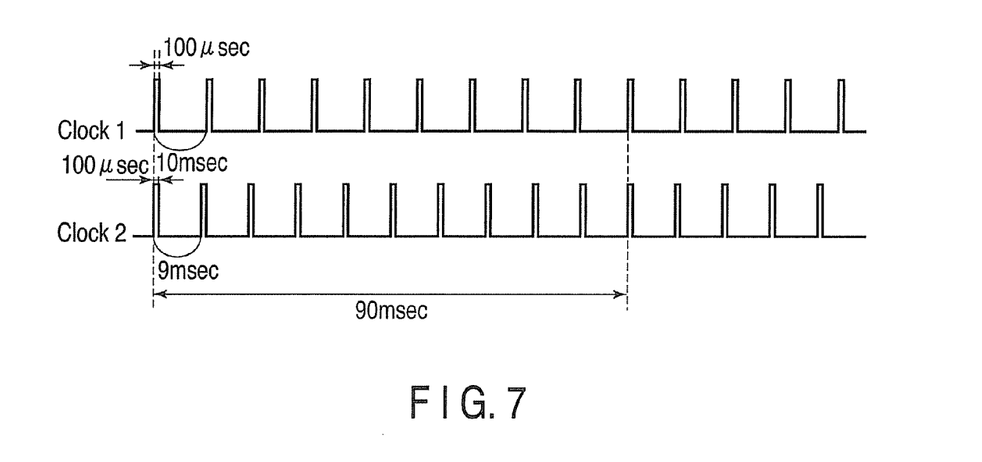
FIG. 7 is a diagram showing a specific example of the two types of clock signals.

FIG. 7 is a diagram showing a specific example of the clock signals of the first and second cycle periods T1 and T2. In this case, the oscillation frequency of the AC power supply 11 is set to 10 kHz. In FIG. 7, the upper part of the diagram shows the first clock signal having the first cycle period T1 of 10 msec and the pulse width of 100 μsec. In FIG. 7, the lower part of the diagram shows the second clock signal having the second cycle period T2 of 9 msec and the pulse width of 100 μsec. Even in the case where the first and second sensor circuits 10, 20 are operated intermittently in different ways from each other, therefore, the relative positions of the first and second members 100, 200 are detected at least once every 0.1 second.

As described above, according to the first embodiment, as long as the first and second members 100, 200 are not in proximity to each other, the first sensor circuit 10 of the sensor apparatus is operated intermittently with the first cycle period T1, and the second sensor circuits 20 is operated intermittently with the second cycle period T2. The second cycle period T2 is determined in such a manner that the leading edge of the second clock signal is appeared in a period in which the first clock signal is maintained in the high level during a predetermined time. In the case where the first and second members 100, 200 are in proximity to each other, on the other hand, the sensor apparatus synchronizes the intermittent operation of the second sensor circuit 20 with the intermittent operation of the first sensor circuit 10.

Even in the case where the cycle period of the intermittent operation is different between the first and second sensor circuits 10 and 20, therefore, the relative positions of the first and second members can be detected at least once for every predetermined time. Also, as long as the first and second members 100, 200 are in proximity to each other, the intermittent operation of the first sensor circuit 10 is synchronized with that of the second sensor circuit 20, and therefore, the timing at which the first and second members 100, 200 come away from each other can be detected with a high accuracy.

Therefore, the sensor apparatus according to this invention can detect the relative positions of the first and second members even in the case where the first member as the object of detection and the second member as the sensor part is operated intermittently with different periods.

Incidentally, this invention is not limited to the embodiment described above. According to the embodiment described above, for example, the first and second members 100 and 200 are judged to be in proximity to each other in the case where the leading edge of the second clock signal is appeared in a period in which the first clock signal is maintained in the high level. This invention, however, is not limited to such a configuration. For example, the same effect is produced as in the aforementioned embodiment by an alternative configuration in which the first and second members 100, 200 are judged to be in proximity to each other as soon as the peak level signal is input from the comparator 26. In such a case, the first and second cycle periods T1 and T2 are set in such a manner that a time periods in which the first and second clock signals are maintained in the high level are overlapped at least once for a predetermined time.

Also, according to the aforementioned embodiment, the first and second cycle periods T1 and T2 are different. By setting the first cycle period shorter than the second cycle period, the power consumption of the second sensor circuit 20 which consumes greater power when the two members are not in proximity to each other can be suppressed, thereby producing a higher power saving effect.

Further, according to the embodiment described above, the relative positions of the first and second members are detected based on the alternating current output from the AC power supply 11. This invention, however, is not limited to such a configuration. For example, a DC power supply may be used in place of the AC power supply, in which case the relative positions of the first and second members can be detected as in the aforementioned embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sensor apparatus for detecting a positional relationship between first and second members having first and second surfaces, respectively, comprising:
    a first electrode provided on the first surface of the first member;
    an applying unit configure to apply a charging signal periodically with a first cycle period to the first electrode so that first charges are induced on the first surface of the first member;
    a second electrode provided on the second surface of the second member to generate electrical detecting signals with the first cycle periods depending on second charges which are induced on the second surface due to the first charges held on the first surface and are changed with the first cycle period depending on a distance between the first and second surfaces;
    a selecting unit configured to select one of the first cycle period and a second cycle period which is different from the first cycle period, the first and second cycle periods being partially overlapped in respective segment periods;
    an output unit which periodically receives the electrical detecting signals from the second electrode, which allows parts of the electrical detecting signals to be output from the output unit during the segment periods, if the second cycle period is selected, and allows the electrical detecting signals to be output from the output unit with the first cycle in synchronized with the charging signals, if the first cycle period is selected;
    a comparator configure to compare an amplitude of the part of the electrical detecting signal or the electrical detecting signal from the output unit with a predetermined threshold value and generate a first comparison signal when the amplitude is not less than the predetermined threshold value and a second comparison signal when the amplitude is less than the predetermined threshold value, respectively; and
    a controller configure to generate, in response to the first comparison signal, a proximity signal which indicates the proximity of the first and second members, and to generate, in response to the second comparison signal, a non-proximity signal which indicates the non-proximity of the first and second members, wherein the selecting unit selects the second cycle period in response to the non-proximity signal, and selects the first cycle period in response to the proximity signal so that the proximity signal is continuously generated depending on the successive generation of the first comparison signals.

2. The sensor apparatus according to claim 1,
wherein the proximity signal is output at a start timing of the second cycle period.

3. The sensor apparatus according to claim 1,
wherein a predetermined period in which at least one of the segment period is appeared is so set as to detect the positional relationship of the first and second members, the predetermined period is sufficiently short as compared with a time taken for the first and second members to come into proximity each other.

4. The sensor apparatus according to claim 1,
wherein the charging signal includes an alternating current.

5. The sensor apparatus according to claim 1,
wherein the second cycle period is longer than the first cycle period.

6. A method used in a sensor apparatus for detecting a positional relationship between first and second members having first and second surfaces on which first and second electrodes are provided, respectively, comprising:
 applying a charging signal periodically with a first cycle period to the first electrode so that first charges are induced on the first surface of the first member;
 inducing second charges on the second surface due to the first charges held on the first surface, wherein the induced second charges held on the second surface are changed depending on a distance between the first and second surfaces, and electrical detecting signals are generated with the first cycle period on the second surface due to the generation on the induced second charges;
 selecting one of the first cycle period and a second cycle period which is different from the first cycle period, the first and second cycle periods being partially overlapped in respective segment periods;
 outputting the electrical detecting signals with the first cycle in synchronized with the charging signals, if the first cycle period is selected, and outputting parts of the electrical detecting signals during the segment periods, if the second cycle period is selected;
 comparing an amplitude of the part of the electrical detecting signal or the electrical detecting signal with a predetermined threshold value;
 generating a first comparison signal when the amplitude is not less than the predetermined threshold value and a second comparison signal when the amplitude is less than the predetermined threshold value, respectively; and
 generating, in response to the first comparison signal, a proximity signal which indicates the proximity of the first and second members and generating, in response to the second comparison signal, a non-proximity signal which indicates the non-proximity of the first and second members, wherein the second cycle period is selected in response to the non-proximity signal, and the first cycle period is selected in response to the proximity signal so that the proximity signal is continuously generated depending on the successive generation of the first comparison signals.

7. The method according to claim 6,
wherein the proximity signal is output at a start timing of the second cycle period.

8. The method according to claim 6,
wherein a predetermined period in which at least one of the segment period is appeared is so set as to detect the positional relationship of the first and second members, the predetermined period is sufficiently short as compared with a time taken for the first and second members to come into proximity each other.

9. The method according to claim 6,
wherein the charging signal includes an alternating current.

10. The method according to claim 6,
wherein the second cycle period is longer than the first cycle period.

* * * * *